United States Patent [19]
Orr

[11] Patent Number: 5,909,357
[45] Date of Patent: Jun. 1, 1999

[54] VERTICALLY STACKED COMPUTER MODULES SHAPED TO INDICATE COMPATIBILITY WITH VERTICAL COOLING SHAFT EXTENDING THROUGHOUT

[76] Inventor: Tom Orr, 1300 Gulfview Woods Ln., Tarpon Springs, Fla. 34689

[21] Appl. No.: 08/840,028

[22] Filed: Apr. 24, 1997

[51] Int. Cl.$^6$ .............................. G06F 1/20; H05K 7/20
[52] U.S. Cl. ........................................... 361/687; 361/690
[58] Field of Search .................................. 361/683, 685, 361/724–727, 687, 690, 688, 689, 692; 312/223.1, 223.2; 364/708.1; G06F 1/16

[56] References Cited

U.S. PATENT DOCUMENTS

| | | | |
|---|---|---|---|
| 4,501,397 | 2/1985 | Sisler ....................................... | 361/730 |
| 5,063,475 | 11/1991 | Balan ....................................... | 361/687 |
| 5,067,040 | 11/1991 | Fallik ....................................... | 361/687 |
| 5,216,579 | 6/1993 | Basara et al. ............................. | 361/683 |
| 5,311,397 | 5/1994 | Harshberger et al. ................... | 361/683 |
| 5,414,591 | 5/1995 | Kimura et al. ............................ | 261/687 |
| 5,515,239 | 5/1996 | Kamerman et al. ..................... | 361/727 |
| 5,602,721 | 2/1997 | Slade et al. ............................... | 361/727 |
| 5,604,662 | 2/1997 | Anderson et al. ........................ | 361/685 |
| 5,737,189 | 4/1998 | Kammersgard et al. ................ | 361/726 |

*Primary Examiner*—Lynn D. Feild
*Attorney, Agent, or Firm*—Smith & Hopen, P.A.; Ronald E. Smith

[57] ABSTRACT

A computer is formed from modular parts that are vertically stacked relative to one another so that even a casual observer may become aware of all of the components of the observed computer system. Each part has a predetermined geometrical configuration and will interlock only with other parts of the same geometrical configuration. In this way, manufacturers of computer components may make parts that are compatible with one another in a common geometrical configuration so that a consumer buying a component need only match shapes to ensure compatibility. An added advantage of the structure is that it enables computer owners to visually display their computer components to their friends and associates, in contrast to present computer housings that hide components and make highly advanced computers look much like their outdated predecessors. A bus interconnects all components and a cooling shaft delivers cooling air to all components.

12 Claims, 4 Drawing Sheets

VERTICALLY STACKED COMPUTER MODULES SHAPED TO INDICATE COMPATIBILITY WITH VERTICAL COOLING SHAFT EXTENDING THROUGHOUT

BACKGROUND OF THE INVENTION

1. Field of the Invention

This invention relates, generally, to computer housings. More particularly, it relates to a computer housing that exposes the features of a computer to visual inspection.

2. Description of the Prior Art

All conventional personal computers, despite their age, look substantially alike. Unlike the automotive industry, the computer industry has chosen to maintain a relatively common exterior appearance for its new makes and models as they are introduced to the consuming public. As a result, the respective exterior housings of an older computer and a new computer share a substantially similar appearance. Thus, a casual observer cannot tell an old computer, lacking many features, from a new computer that is loaded with advanced features.

Many people take pride in their computers, and wish their new, improved computers looked different from their old ones. Under current technology, however, a person who has just spend a substantial sum of money in purchasing a new computer system or upgrading an older one has nothing to show to his or her friends; the new or improved computer will look much like the older one. This is a state of affairs quite different from the automobile industry, the housing industry, and the like, where a new purchase can be admired by all from a visual perspective.

Moreover, there are times when a computer user wants to know the status of a component, but cannot because the component is internal, i.e., inside the computer housing and thus not available for casual inspection. Many people buy external modems for this reason, i.e., they need to see the function lights of the modem and cannot do so if they purchase an internal modem. Unfortunately, external modems take up desk space.

What is needed, then, is a new type of computer housing. The improved housing would enable the proud owner of a new computer or a new computer component to visually display it to admiring friends. It would also enable computer users to visually ascertain the status of various computer components without forcing them to purchase external components of the kind that rob them of desk space.

Another problem in the computer industry is the problem of compatibility. Many consumers purchase new parts for their computers, in an attempt to upgrade performance, only to discover that the newly purchased component cannot be added to their existing system. Visual inspection of the new components is of little value because, again, the known components lack distinctive design features.

The worse-case scenario is when a new component is installed without knowledge that it is incompatible with the preexisting components, thereby frying the computer.

Thus, there is a clear need for a solution to the compatibility problem.

Still another problem of the current computer industry is the fact that many component makers are at the mercy of the large computer assemblers. Most name brand computer companies are mere assemblers; they manufacture no components whatsoever. The manufacturers of components are at the mercy of such assemblers, however; the component manufactuers lack the means to sell their components directly to consumers. There have been cases where advanced components were withheld from the market for up to a year by computer assemblers who want to sell their inventory of computers with old components before allowing the public to have access to the improved components. Such practice damages the public as well as the component manufaturers.

Thus, a need exists as well for a means that enables component manufacturers to sell their components directly to the public without the interference of computer assemblers.

However, in view of the art considered as a whole at the time the present invention was made, it was not obvious to those of ordinary skill in this art how the needed improvements in computer housings could be provided. Nor was it obvious how the compatibility and component availability problems could be solved.

SUMMARY OF THE INVENTION

The longstanding but heretofore unfulfilled needs for a computer housing that overcomes the limitations of the prior art, and for a new system of selling components that would resolve the current compatibility and availability problems, are now both met by a new, useful, and nonobvious invention. The present invention includes a computer housing formed by a plurality of vertically stacked modules. Each of the modules houses a component having utility in a computer system, and each of the modules has a common predetermined geometric configuration. The housing further includes a bus means for interconnecting the modules to one another, and a cooling shaft collectively formed in the modules. Mechanical interconnecting means for mechanically interconnecting the modules to contiguous modules are also provided. The vertically stacked modules visually display the components of the computer system while taking up minimal space. The modules also enable manufacturers to make compatible modules having a common predetermined geometric configuration so that consumers may ensure compatibility of components by purchasing modules having a common predetermined geometric configuration. Thus, if two modules fit together, their components are compatible with one another. If two modules do not fit together, they are incompatible with each other.

Each of the modules has a central cooling opening so that the cooling shaft is centrally formed in the computer system collectively formed by the modules.

It is a primary object of this invention to revolutionize the way computers are sold by providing a new type of computer housing that displays the various components of the computer in a visual manner heretofore unknown.

Another object is to assist consumers and manufacturers in purchasing and manufacturing new components, respectively, in a manner that facilitates the purchase of new components that are compatible with preexisting components.

These and other important objects, features, and advantages of the invention will become apparent as this description proceeds.

The invention accordingly comprises the features of construction, combination of elements and arrangement of parts that will be exemplified in the construction hereinafter set forth, and the scope of the invention will be indicated in the claims.

BRIEF DESCRIPTION OF THE DRAWINGS

For a fuller understanding of the nature and objects of the invention, reference should be made to the following detailed description, taken in connection with the accompanying drawings, in which.

DETAILED DESCRIPTION OF THE PREFERRED EMBODIMENT

Figure 1:
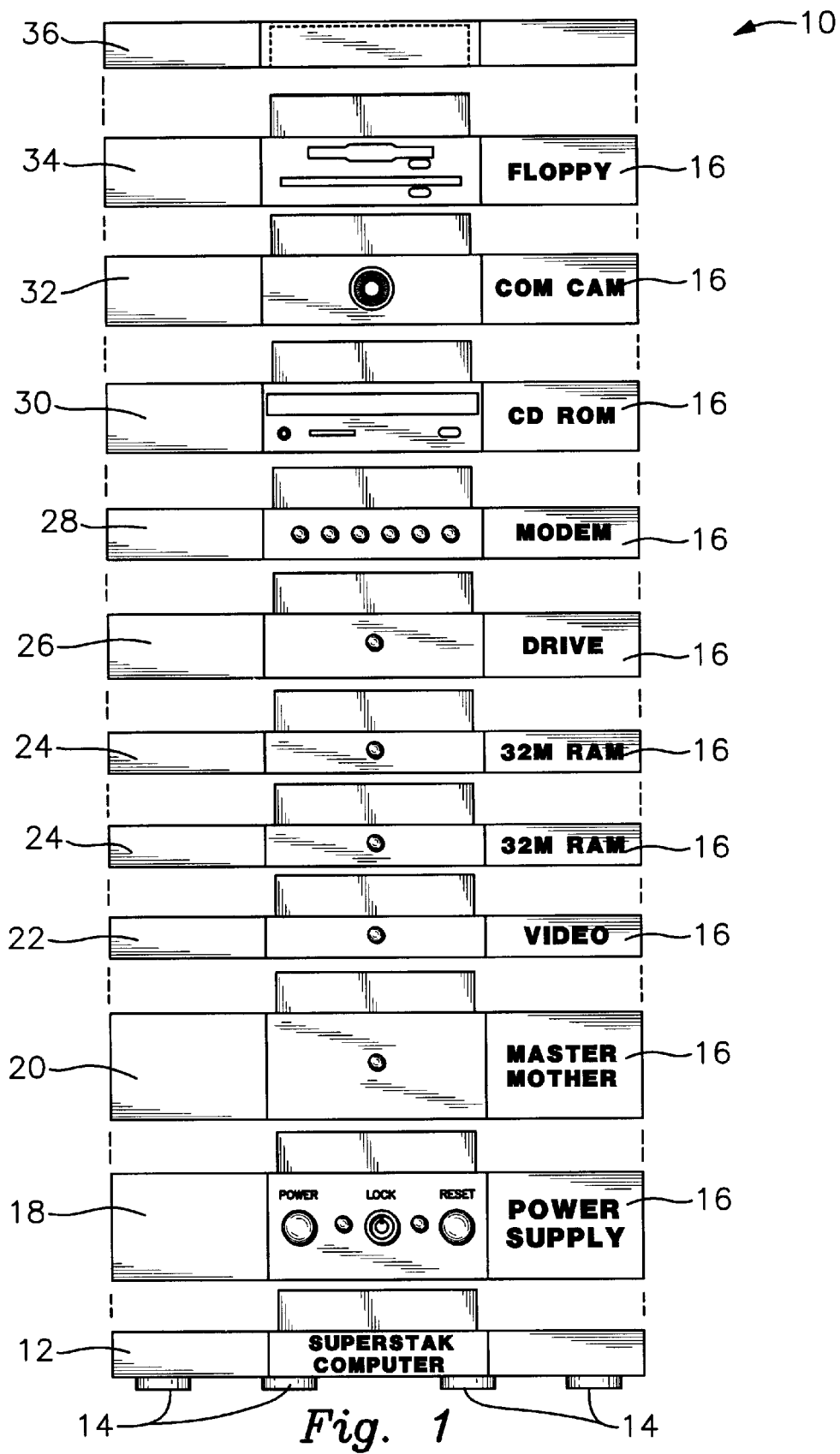
FIG. 1 is an exploded front elevational view of an illustrative embodiment of the present invention.
Figure 2:
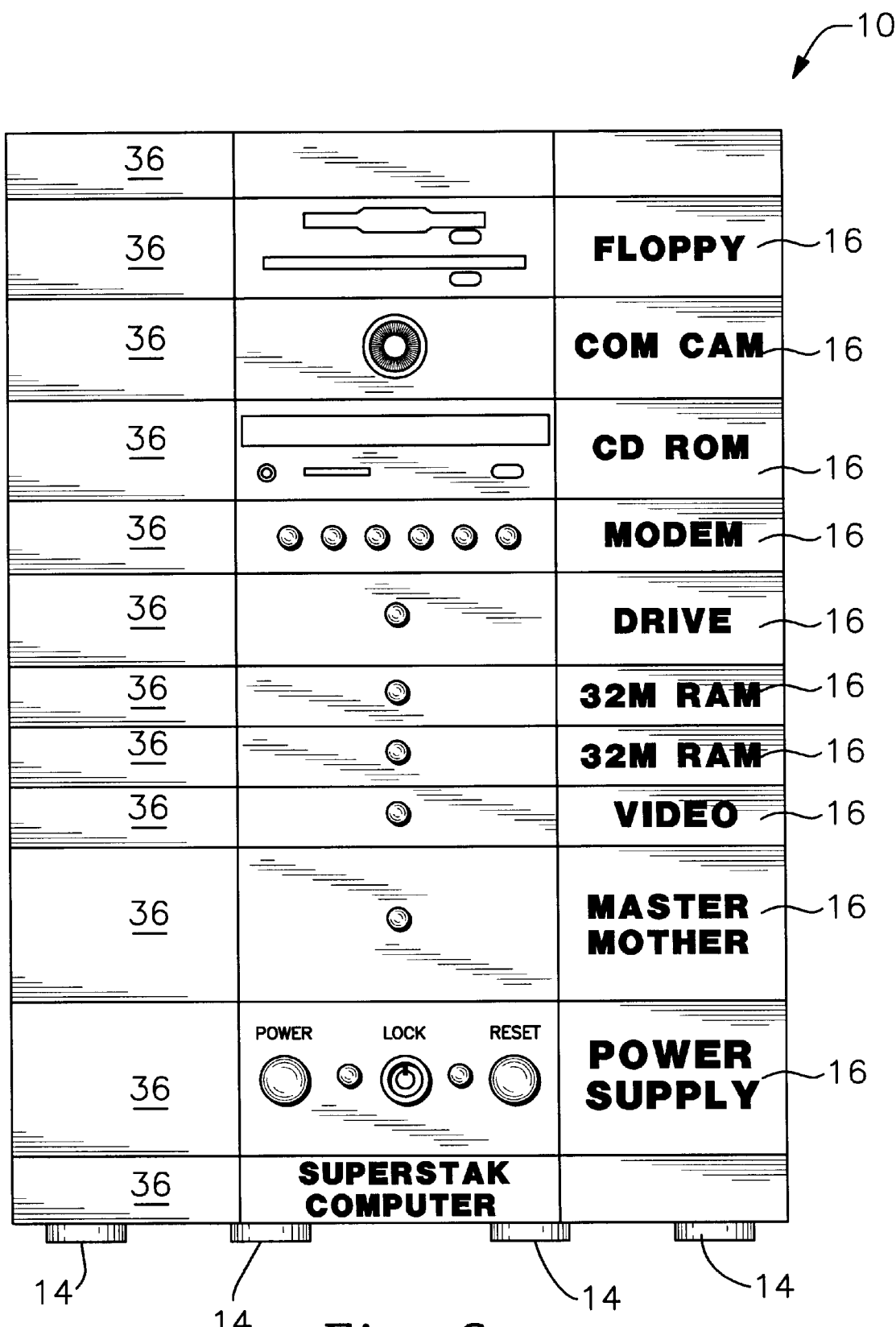
FIG. 2 is an assembled front elevational view thereof.

Referring now to FIGS. 1 and 2, it will there be seen that an exemplary embodiment of the invention is denoted as a whole by the reference numeral 10.

Computer housing 10, to be known commercially as a Superstak™ computer, is formed by vertically stacking a plurality of computer components, each of which preferably has a substantially flat top wall and a substantially flat bottom wall. In this particular embodiment, a base 12 supported by legs, collectively denoted 14, is employed; the trademark could be written on such base if desired. Base 12 is flat so that it provides a foundation upon which all components may be securely stacked. Significantly, it may have any predetermined geometric configuration and any predetermined size; in the embodiment depicted, it has an octagonal configuration, as perhaps best understood in connection with FIG. 3. Accordingly, all components stacked atop base 12 must have an octagonal configuration as well. Preferably, all components have a common width or breadth so that the tower collectively formed thereby has a uniform breadth. The depth or height of the individual components may vary between components as depicted in FIG. 1 because varying heights are not unpleasing to the eye and may be required from a functional standpoint.

The individual modules are collectively denoted 16; although specific modules are illustrated herein, this invention is not limited to the illustrated modules but applies to all modules housing computer components without limitation.

Figure 5:
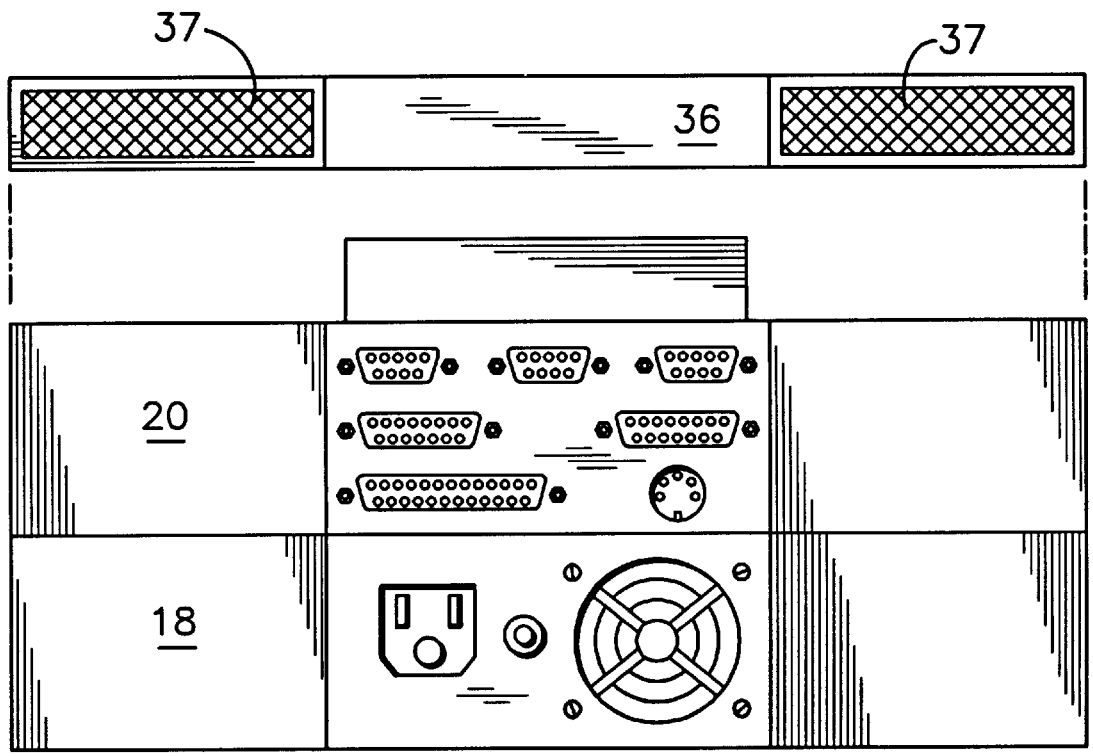
FIG. 5 is a rear elevational view, partially exploded view of a few illustrative modules.

For example purposes only, the lowermost module 18 houses a power supply. Although the power supply could be placed at any location, it seems best to position it at the bottom of the stack of modules so that the power cord need not extend upwardly to a higher location. See FIG. 5 where the rear side of the power supply is depicted.

For essentially the same reason, a module 20 housing a mother board is depicted atop power supply module 18, i.e., the printer, keyboard, mouse, and other cables that attach to the rear panel of a mother board module are best positioned near the bottom of the stack of modules.

Module 22 holds a video card. With conventional computer housings, an observer cannot tell by observing a computer whether or not it is equipped with a video card. Thus, the owner of a conventional computer having an internal video card that cannot be seen without removing the cover of the computer does not enjoy the prestige of video card ownership as does the owner of a Superstak computer housing. Moreover, since the manufacturer's name and/or brand name of the video card may also be provided through indicia means, still more prestige may be enjoyed when a prestigous trademark indicating a high quality manufacturer is displayed.

In this example, the next two modules are collectively denoted 24 because both modules contain memory. In this particular embodiment, each module holds 32 megabytes of RAM. Again, a conventional computer equipped with 64 meg of RAM looks the same as a computer having a mere 4 meg.

Module 26 houses a Jazz® or Zip® external hard drive, module 28 houses a high-speed modem, module 30 houses a CD ROM drive, module 32 houses a camera lens, and module 34 houses a floppy drive. Module 36 is a blank module, i.e., it houses no components; it is provided to cap off the stack so that dust does not enter into the novel central cooling tower. Vents 37 on a back wall of blank module 36 (see FIG. 5) allow the circulating air to leave the stack. Blank module 36 also serves to cover up the pin housing, discussed below.

Additional modules could house an audio card or any other computer component. Each module may be brightly colored and may carry indicia means identifying the manufacturer of the module and the function performed by the module as well.

In this way, a computer owner visually displays his or her computer components and enjoys a pride of ownership not afforded by conventional computer housings. The Superstak will increase status sales because computer owners will compare the respective heights of their stacks, and bragging rights will be won by the owner of the tallest stack.

At this point, the significance of the geometric configuration of each module 16 can be appreciated. As purchasers of RAM know, not all RAM can be used in all computers due to compatibility problems. Many people buy memory from catalogs and then discover that the new memory is incompatible with their computer. By packaging memory in vertically stackable modules, manufacturers can identify the compatibility of their memory by manufacturing it in modules having a shape that interlocks only with modules of other computer components with which said memory is compatible.

The same observation applies to the other components as well. Not all components will be compatible with a particular mother board, for example. As a result, many people are afraid to purchase new components when they are unsure as to compatibility. This invention, by introducing modules having particular shapes to indicate with which other components they may be used, clearly solves this problem. If a person owns a mother board of a particular shape, that person knows that any CD ROM, any memory, and so on that is packaged in a module of the same shape is compatible with the mother board. In the depicted example, the Superstak computer housing has an octagonal shape. Thus, all components packaged in an octagonal module will be compatible with one another because manufacturers who adopt the present invention will know not to package incompatible components in modules having the same geometric configuration. Consumers will know that if they purchase components that are housed in modules having the same shape as their existing modules, then compatibility is ensured. This simple but revolutionary concept gives manufacturers direct access to consumers. People lacking computer literacy can call a manufacturer and order components without difficulty. For example, a caller could order 12 megs of RAM and tell the manufacturer that their stack is square, circular, pentagonal, and so on; the manufacturer can then fill the order by shipping a component in a module of matching shape. In a retail setting, a customer lacking computer literacy can simply purchase a new mother board having five sides, for example, without having to worry about compatibility, if the other modules of his or her computer has that number of sides.

Figure 3:
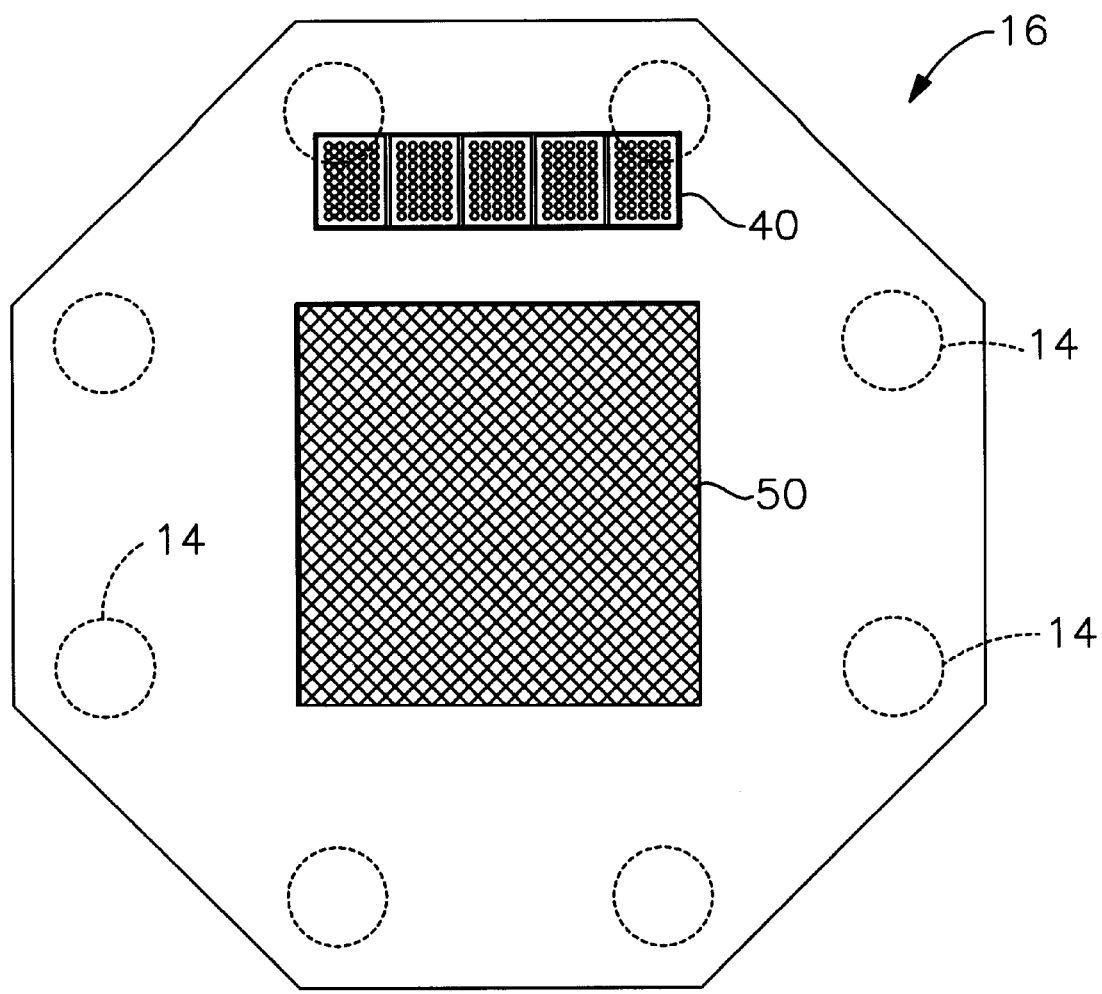
FIG. 3 is a plan view thereof.
Figure 4:
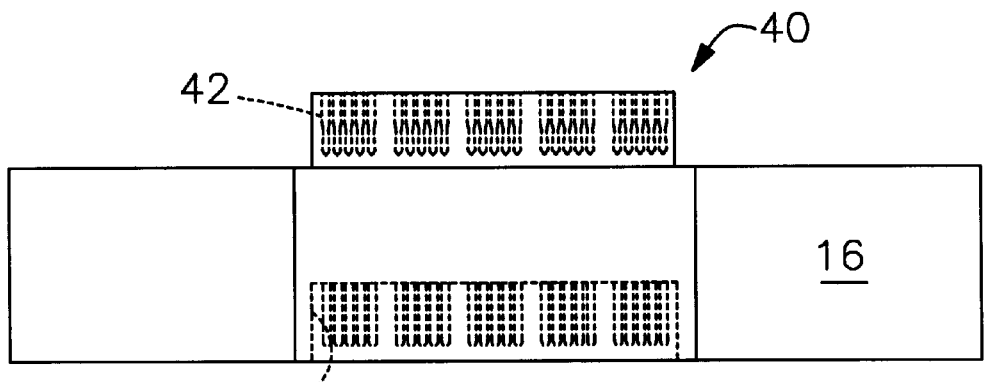
FIG. 4 is a front sectional view of a module, showing the pins and sockets thereof.

As best understood in connection with FIGS. 3 and 4, a vertically extending central bus 40 interconnects all components. The interconnection may be electromechanical, optical, infrared, radio frequency, or the like. Connections between modules could be made through the use of external or internal cables, or through the use of built in connectors.

In a preferred embodiment, as best understood in connection with FIG. 4, each module 16 includes a plurality of upwardly-opening pin sockets formed in a housing 42 that protrudes upwardly from the flat top wall of the module and a plurality of depending pins positioned in a recess 44 formed in the flat bottom wall of the module. In this way, the pins are protected from bending by being recessed. Numerous alternative pin interconnections will be apparent to those of ordinary skill in the art and all such variants of the depicted interconnection means are within the scope of this invention as a matter of law.

The insertion of protrudng part 42 into recess 44 also provides a mechanical means for interconnecting contiguous modules. Numerous other mechanical interconnecting means are within the scope of this invention.

As depicted in FIG. 3, the novel housing also includes a central cooling shaft or cooling tower 50 that distributes circulating air to cool the various modules as needed. A fan, not shown, could be added to enhance the circulation. It is worth noting that stack surmounting cap 36 need not be provided because the blower should be sufficient to blow out dust that might accummulate in the cooling shaft. Cap 36 would probably have utility primarily in keeping dust out of a Superstak unit that is seldom used.

Each component 16 is provided in its own module and may be provided in colorful modules with brand name markings thereon. As a result, the novel computer housing makes all of its components external, i.e., all function or status lights of all components may be observed at all times, thereby ending the problem with internal modems and other internal devices. Since the modules are vertically stacked, they take up no additional desk space. "Intel Inside" stickers, e.g., will become obsolete as the Intel® module becomes just another module of the fully visible vertically stacked modules.

Even more importantly, whenever a component manufacturer develops an improved component, that manufacturer will no longer be at the mercy of computer assemblers because the new, improved component can be sold directly to consumers. This frees component manufacturers and the purchasing public from the control of computer assemblers. Since component modules having the same shape will be compatible with one another, there is no worry about frying a computer by adding an incompatible component.

Once computer component manufacturers adopt this breakthrough invention as the industry standard, there will be no further need for computer assemblers. Any layperson will be able to assemble their own computer by simply buying modules that physically match one another. This frees computer purchasers from having to take whatever configurations the computer assemblers have prepared for them.

Moreover, computer assemblers often purchase the cheapest individual components available. Thus, a cool-operating power supply already in production that does not require a big, noisy fan such as required by cheap power supplies is not readily available to consumers because computer assemblers do not wish to increase the cost of their packages. If the quiet-running power supply were available in its own module, which module would be appropriately shaped to indicate its compatibility, then those consumers who value a quiet computer could pay the required premium and enjoy the resulting quietude. The same observation applies to improved video cards and the like.

Figure 6:
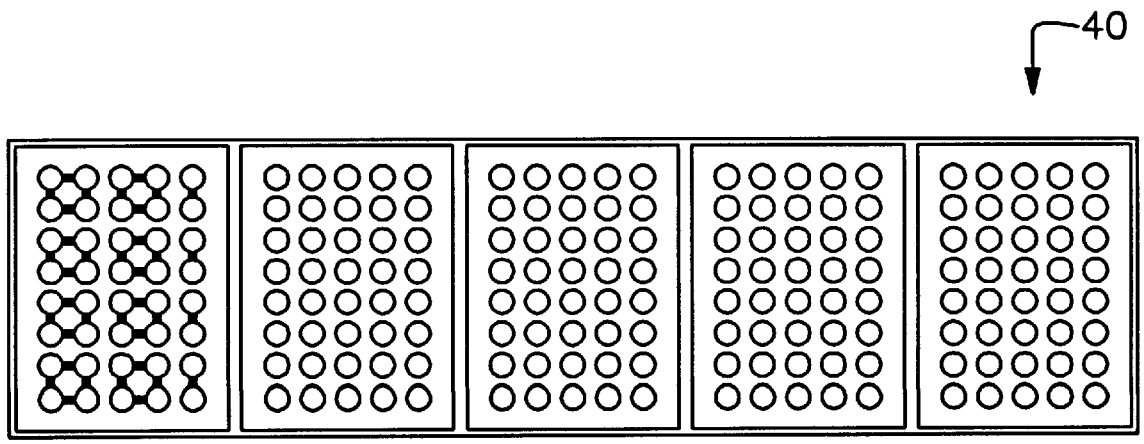
FIG. 6 is an enlarged view of the bus means depicted in FIG. 3.

FIG. 6 depicts bus 40 in an enlarged view relative to FIG. 3. Bus 40 could also take the form of a Universal Serial Bus (USB), IEEE 1394 (also known as "FireWire,"™ or other bus.

Although the individual modules are depicted as being flat, it is clearly within the scope of this invention to provide modules having top and bottom walls that are not flat. The only requirement is that contiguous top and bottom walls interconnect with one another in such a way that the stack of modules is stable. In this way, a stack may become quite tall without becoming precarious.

It will thus be seen that the objects set forth above, and those made apparent from the foregoing description, are efficiently attained and since certain changes may be made in the foregoing construction without departing from the scope of the invention, it is intended that all matters contained in the foregoing construction or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described,

What is claimed is:

1. A computer, comprising:
a stack formed by a plurality of vertically stacked modules, each module housing a component having utility in a computer system, and each module in said stack having a common predetermined geometric configuration;

bus means for interconnecting each module of said plurality of vertically stacked modules to modules contiguous to it;

a vertical cooling shaft formed in each module of said plurality of vertically stacked modules aligned with the cooling shafts in all modules thereby forming a vertical cooling shaft extending throughout the stack;

mechanical interconnecting means for mechanically interconnecting each module to contiguous modules; and each module in said stack cooperating with each other module in said stack so that a functional computer system is collectively formed by said stack of modules;

each of said stacked modules visually displaying each component of said functional computer system; and said predetermined geometric configuration being unique to all modules compatible with each other, indicating the compatibility of modules having said predetermined geometric configuration and incompatible with modules having a different geometric configuration thereby permitting the use of a geometric configuration to indicate the compatibility or incompatibility of modules making up a computer.

2. The computer system of claim 1, wherein each of said modules has a central opening formed therein so that said cooling shaft is centrally formed in said computer system formed of said plurality of vertically stacked modules.

3. The computer system of claim 1, further comprising a flat base for supporting said plurality of vertically stacked modules, said flat base having said common predetermined geometric configuration.

4. The computer system of claim 1, further comprising indicia means applied to each module of said plurality of vertically stacked modules that identifies the function of each module.

5. The computer system of claim 1, further comprising indicia means applied to each module of said plurality of vertically stacked modules that identifies the manufacturer of each module.

6. The computer system of claim 1, wherein each of said modules has a substantially flat top wall and a substantially flat bottom wall.

7. The computer system of claim 1, wherein each of said modules has a common dimension so that said stack of modules has a uniform breadth.

8. The computer system of claim 6, wherein said bus means includes a pin socket housing that protrudes upwardly from said flat top wall of each of said modules and a pin housing that is recessed within said flat bottom wall of each of said modules.

9. The computer system of claim 1, further comprising a blank module that surmounts said stack of modules for closing said cooling shaft.

10. The computer system of claim 9, further comprising a vent means formed in said blank module.

11. The computer system of claim 10, wherein said vent means is positioned on a rear side of said blank module.

12. The computer system of claim 8, wherein said pin socket housing and said pin housing collectively form said mechanical interconnecting means.

\* \* \* \* \*